(12) United States Patent
Bohlender et al.

(10) Patent No.: US 10,136,474 B2
(45) Date of Patent: Nov. 20, 2018

(54) HEAT GENERATING ELEMENT

(71) Applicant: Eberspacher catem GmbH & Co. KG, Herxheim (DE)

(72) Inventors: Franz Bohlender, Kandel (DE);
Holger Reiss, Rheinzabern (DE);
Michael Niederer, Kapellen-Drusweller (DE); Christian Morgen, Rulzheim (DE)

(73) Assignee: Eberspacher catem GmbH & Co. KG, Herxheim (DE)

( * ) Notice: Subject to any disclaimer, the term of this patent is extended or adjusted under 35 U.S.C. 154(b) by 186 days.

(21) Appl. No.: 14/414,162

(22) PCT Filed: Jul. 10, 2013

(86) PCT No.: PCT/EP2013/002038
§ 371 (c)(1),
(2) Date: Jan. 12, 2015

(87) PCT Pub. No.: WO2014/009013
PCT Pub. Date: Jan. 16, 2014

(65) Prior Publication Data
US 2015/0215994 A1 Jul. 30, 2015

(30) Foreign Application Priority Data

Jul. 11, 2012 (DE) .................. 10 2012 013 770

(51) Int. Cl.
*H05B 3/00* (2006.01)
*H05B 3/24* (2006.01)
(Continued)

(52) U.S. Cl.
CPC .......... *H05B 3/24* (2013.01); *B32B 37/1292* (2013.01); *B32B 37/18* (2013.01); *H05K 9/0007* (2013.01);
(Continued)

(58) Field of Classification Search
CPC ............... B32B 37/1292; B32B 37/18; B32B 2037/1253; B32B 2457/00; H05B 3/24;
(Continued)

(56) References Cited

U.S. PATENT DOCUMENTS 4,371,777 A * 2/1983 Roller ...................... H05B 3/14
219/505
4,689,878 A * 9/1987 Beauregard .............. H05B 3/14
219/505

(Continued)

FOREIGN PATENT DOCUMENTS

CA 1100560 A1 5/1981
DE 10333451 A1 11/2004
(Continued)

*Primary Examiner* — Ibrahime A Abraham
*Assistant Examiner* — Chris Liu
(74) *Attorney, Agent, or Firm* — Boyle Fredrickson, S.C.

(57) ABSTRACT

A heat generating element for an electrical heating device of a motor vehicle, including at least one PTC element and two contact plates which are in contact with opposite sides of the PTC element and are provided on their outer side facing away from the PTC element with an insulating layer. Shielding is provided, comprising a first shell-like shielding plate and a second shell-like shielding plate which are each provided on the outer side of the insulating layer and are connected thereto in a thermally conductive manner. The longitudinal wall sections, directed towards one another, of the first and second shielding plate form an overlapping region. In order to reduce EMC problems, two shielding plates are sealed by way of an adhesive which is received in one of the two shielding plates and into which the end of a rim of the other shielding plate dips.

16 Claims, 5 Drawing Sheets

(51) Int. Cl.
*B32B 37/12* (2006.01)
*B32B 37/18* (2006.01)
*H05K 9/00* (2006.01)

(52) U.S. Cl.
CPC ... *B32B 2037/1253* (2013.01); *B32B 2457/00* (2013.01); *H05B 2203/017* (2013.01); *H05B 2203/02* (2013.01); *H05B 2203/023* (2013.01); *Y10T 156/10* (2015.01)

(58) Field of Classification Search
CPC .......... H05B 2203/017; H05B 2203/02; H05B 2203/023; H05K 9/0007; Y10T 156/10
USPC .......... 156/60; 219/540, 201, 202, 204, 504, 219/520, 537, 541, 544, 548, 467.1, 208, 219/530; 392/347, 354
See application file for complete search history.

(56) References Cited

U.S. PATENT DOCUMENTS

| | | | |
|---|---|---|---|
| 4,698,614 A * | 10/1987 | Welch | H01C 1/02 219/544 |
| 4,814,584 A | 3/1989 | Bohlender et al. | |
| 5,598,502 A * | 1/1997 | Takahashi | H05B 3/14 219/505 |
| 7,667,166 B2 * | 2/2010 | Zeyen | F24H 3/0405 165/175 |
| 7,676,144 B2 | 3/2010 | Zeyen et al. | |
| 2005/0133490 A1 * | 6/2005 | Brun | F24H 3/0429 219/202 |
| 2007/0145035 A1 * | 6/2007 | Zeyen | F24H 3/0429 219/520 |
| 2008/0073336 A1 * | 3/2008 | Bohlender | F24H 3/0429 219/467.1 |
| 2009/0020515 A1 * | 1/2009 | Clade | F24H 3/0405 219/202 |
| 2009/0020619 A1 * | 1/2009 | Bohlender | F24H 3/0405 237/12.3 C |
| 2009/0026191 A1 * | 1/2009 | Bohlender | F24H 3/0405 219/520 |
| 2009/0026194 A1 * | 1/2009 | Bohlender | F24H 3/0405 219/532 |
| 2010/0044360 A1 * | 2/2010 | Niederer | H01C 1/022 219/202 |
| 2011/0062137 A1 * | 3/2011 | Wu | B60S 1/488 219/202 |
| 2011/0068090 A1 * | 3/2011 | Bohlender | B60H 1/2225 219/202 |

FOREIGN PATENT DOCUMENTS

| | | |
|---|---|---|
| EP | 1 916 873 A1 | 4/2008 |
| EP | 2190256 A1 | 5/2010 |
| EP | 2393336 A1 | 12/2011 |
| EP | 2395295 A1 | 12/2011 |
| GB | 1 583 771 A | 2/1981 |
| WO | 2011/083115 A1 | 7/2011 |

* cited by examiner

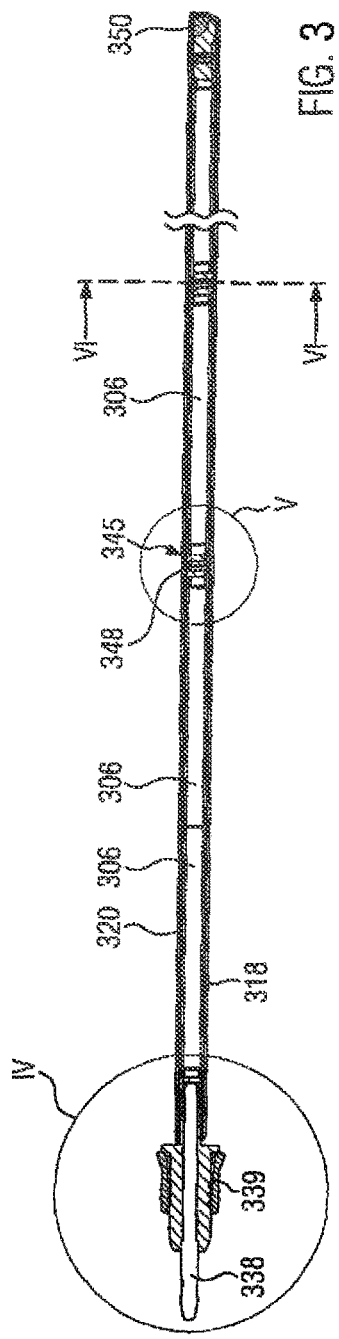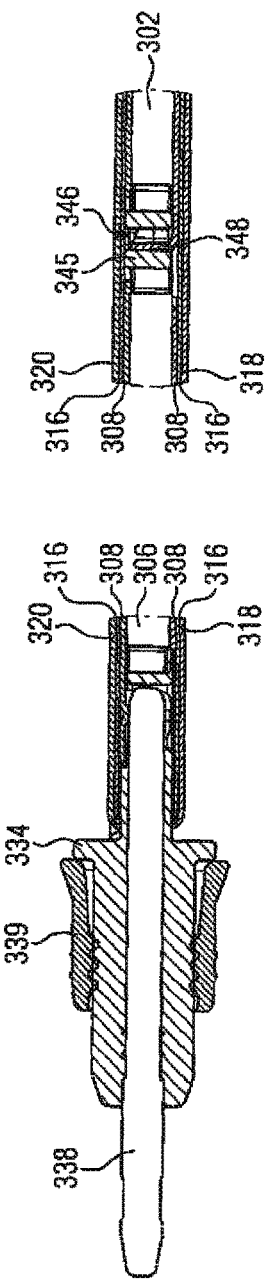
FIG. 3
FIG. 4
FIG. 5

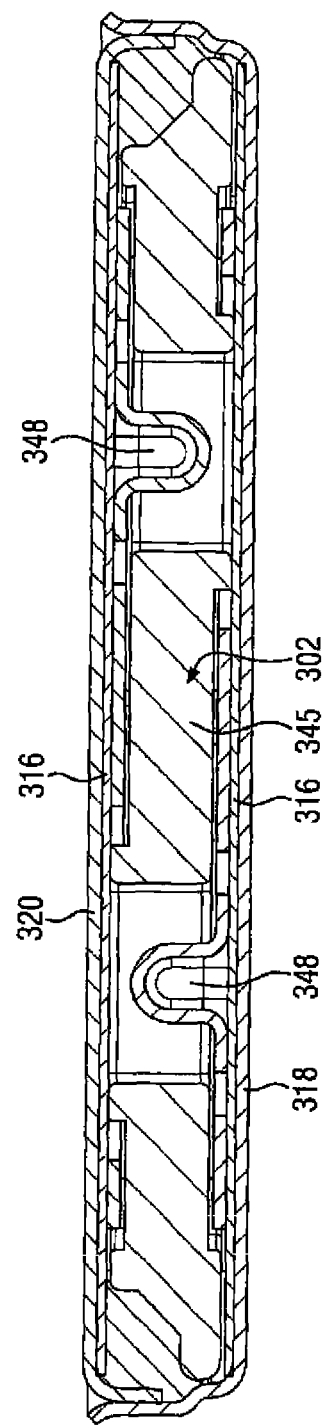

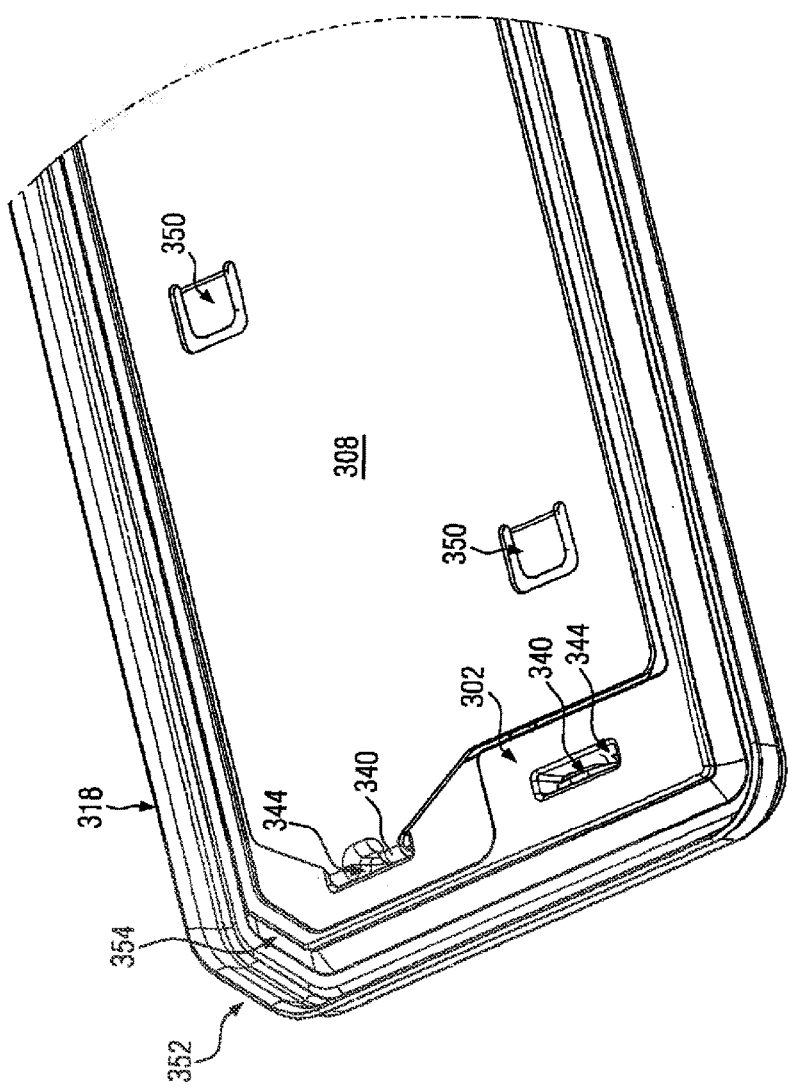

HEAT GENERATING ELEMENT

BACKGROUND OF THE INVENTION

1. Field of the Invention

The present invention relates to a heat generating element, in particular for an electric heating device of a motor vehicle, preferably with a positioning frame forming a holding fixture in which at least one PTC element is received, and two contact plates which are in contact with opposite sides of the PTC element.

2. Discussion of the Related Art

Such heat generating elements are generally known as a component of an electric heating device, in particular for heating air in a motor vehicle, which is also to be further developed with the present invention. The heat generating element forms a layer of a layered structure which commonly comprises corrugated fin elements that are in contact with both sides of the heat generating element. This layered structure commonly has at least a plurality of layers of corrugated fin elements and heat generating elements stacked in a plane.

A generic heat generating element is known from EP 2 190 256 A1. In this prior art, corrugated fins that are on the outside in contact with the heat generating element are adhesively bonded with the heat generating element. For this, curing insulating adhesive, such as silicone, is introduced into free spaces within the positioning frame and fills the remaining free spaces, so that the interior of the positioning frame is to be sealed hermetically by the insulating cured adhesive against the environment. The curing adhesive also reaches the phase boundary between the heat generating element and the corrugated fin elements, so that these corrugated fin elements are after curing of the adhesive connected to the heat generating element. The result is a self-contained heating rod that can as such be handled and placed or inserted into an electrical heating device.

The proposed solution according to EP 2 190 256 A1 has certain drawbacks. For example, heat expansion occurs during operation of the heat generating element. Due to the different nature of the components constituting the heat generating element, different thermal expansions arise. The cured insulating adhesive can not reliably compensate the different expansion values Permanent cracking occurs, so that the desired sealing effect by the cured adhesive for the heat generating element is lost.

Electrical heating devices comprising a heat generating element of the generic kind sometimes cause electromagnetic interference which are undesirable in particular in a motor vehicle as they are noticeable acoustically, for example, when operating a radio in the vehicle interior.

SUMMARY OF THE INVENTION

The present invention is based in particular on a heat generating element as is known from EP 2 395 295 A1. This prior art with its embodiment according to FIGS. 12 to 14 shows a heat generating element for an electrical heating device of a motor vehicle with two shell-like shielding plates, where the shell-like shielding plates in this prior art have a substantially U-shaped cross section. The shell-like shielding plates, however, form only an enclosure on the rim side like a tube that is open at the face sides. Total shielding is only achieved by end pieces that are at the end sides mounted onto the free ends of the tube. The two half shells can according to the disclosure of EP 2 395 295 A1 be formed of metal and after joining be connected by adhesive bonding.

The present invention is based on the problem of providing a heat generating element, in particular for an electrical heating device for a motor vehicle, which takes into account the EMC problems in an improved manner and securely insulates against the environment and protects from the ingress of environmental influences. Furthermore, the present invention is to provide a method for producing such a heat generating element.

To solve the problem according to the device, the present invention proposes a heat generating element including at least one PTC element and two contact plates which are in contact with opposite sides of said PTC element and are provided on their outer side facing away from said PTC element with an insulating layer. Shielding is provided comprising a first shell-like shielding plate and a second shell-like shielding plate which are each provided on the outer side of said insulating layer and are connected thereto in a thermally conductive manner. Longitudinal wall sections, directed towards one another, of said first and second shielding plate form an overlapping region. The two shielding plates are sealed by way of an adhesive which is received in one of said two shielding plates and into which the end of a rim of said other shielding plate dips. This heat generating element thus comprises shielding which shields against the electromagnetic radiation caused by the heat generating element and its operation. Accordingly, the electrically conductive contact plates as well as the PTC element of the heat generating element are encased by the shield. The shielding is not in direct electrical contact with the current-carrying elements of the heat generating element, i.e. the contact plates and the least one PTC element. The plates forming the shielding are accordingly commonly electrically insulated from the current-carrying elements.

Though more than two shielding plates can be provided, which are commonly overall connected electrically to each other, i.e. are connected to each other in an electrically conductive manner, commonly only two shielding plates are used for reasons of manufacture.

In view of good dissipation and hence a high degree of efficiency of the PTC element, the first and the second shielding plates are in a thermally conductive manner connected to the insulating layer, which in turn is commonly in direct contact with the associated contact plate. This therefore results in a preferably layered structure with the PTC elements located on the inside, contact plates which are in contact with opposite sides thereof, and insulating layers that are in turn in direct contact with their outer side. These insulating layers can be formed from ceramic and/or plastic film. Particularly preferred is a film made of polyimide or silicone. The layered structure in turn has the first and the second shielding plates on its outer side. The first and the second shielding plates there have an at least shell-like configuration, so that the joined shielding plates form a tube possibly still open at the end sides which can be closed by end caps further completing the shielding at the face sides. The shielding plates, however, preferably have a pan-shaped configuration with a substantially circumferentially encircling rim which also on the edge side overlaps the commonly elongated heat generating element comprising several PTC elements arranged in the longitudinal direction one behind the other. The bent rim of the two pan-shaped shielding plates accordingly reaches over part of the positioning frame.

The two shielding plates are preferably configured such that they have an overlapping region in which the shielding plates are each provided on the rim immediately adjacent to each other, contacting each other, and in two layers. Pan-shaped shielding plates result in an encircling overlapping region in the circumferential direction. With shell-like configurations, the overlapping region arises on the opposite longitudinal sides. A pan-shaped configuration is a shell-like configuration with rims provided on the face side, i.e. at oppositely disposed ends of the tube. In the overlapping region, the shielding plates commonly electrically contact each other, so that total shielding results for the PTC element and the two contact plates in contact therewith. Only a few contact points for contacting the two shielding plate can be provided in the overlapping region. In the case of a joint area, they preferably directly adjoin each other along a large portion of their face-side length. In an overlapping region, the shielding plates reach across each other in the vertical direction. Due to the pan-shaped configuration, both shielding plates comprise longitudinal wall sections extending substantially in the vertical direction of the PTC element. The longitudinal wall sections are formed circumferentially encircling and preferably only experience a through hole where contact pins are from the outside led up to the contact plates to electrically connect the heat generating element. In the overlapping region, the longitudinal wall section of one of the shielding plates, which is hereinafter also referred to as a lower shielding plate, extends outwardly and accordingly forms a holding fixture for the longitudinal wall section of the other shielding plate. In this overlapping region, the shielding plates commonly contact each other. The free end of the outwardly extending longitudinal wall section preferably has an outwardly formed funnel-like configuration, so that the positioning frame and also the other regularly second shielding plate can be easily introduced into the lower first shielding plate.

Furthermore according to the invention, the shielding plates are sealed by adhesive in the overlapping region. This curing adhesive seals at least the first shielding plate against the second shielding plate. Due to the desired contact of the two shielding plates and in view of a secure seal, a major portion, preferably all curing adhesive is located in the interior of the shielding and seals the free end or ends of the shielding plates. The adhesive is preferably silicone adhesive exhibiting certain elasticity and, moreover, good electrically insulating properties. The adhesive is due to its elasticity preferably introduced for filling a particular chamber volume such that the adhesive does not cure as a thin film, but that a bead-like sealing strip is formed around in the circumferential direction by the adhesive.

This bead-like sealing strip of adhesive, which can also be referred to as a bead of adhesive, provides a certain volume into which one rim of the shielding plate commonly provided on the inside dips and thereby seals the volume provided within the shielding against the atmosphere. The rim of the shielding plate dipping into the adhesive is there commonly located also on the inner wall of the outer shell-like shielding plate. In view of a very good and reliable seal, however, the front end of the rim of the inner shielding plate can be bent inwardly and thereby both bear against the inner circumference of the encircling rim in an electrically conductive manner and on the outer circumference be dipped securely into the bead of adhesive.

For forming a suitably large chamber volume, the circumferential outer rim is adapted to a preferably provided positioning frame with at least one holding fixture for the at least one PTC element. Typically, the positioning frame is fitted at the free space defined between the positioning frame and the shield. The positioning frame is preferably configured such that it projects backwardly in part or totally at the outer rim, thereby forming a chamber in which the adhesive can be introduced with the required volume.

In view to the best possible creepage and air distances, which are of significance in particular during operation of the electrical heating device under high-voltage conditions, for example, in an electric vehicle, it is to be ensured that the electrified parts of the heat generating element are adequate spaced from the non-electrified and insulating parts. The cured adhesive preferably there contacts no exposed surfaces of the contact plates and the PTC element. Exposed surfaces of the PTC elements are, in particular, the overlapping rims of the contact plates and the face sides of the PTC element which extend between the two contact plates. Also the face-side rim surfaces of the contact plates are usually exposed. For this, the positioning frame regularly has a stepped structure which is notched such that the contact plates with their free rim extending over the PTC element or elements, respectively, indeed cover part of the positioning frame, but do not contact the positioning frame or do not bear thereagainst at the face side, respectively. One or both insulating layers can be connected to the positioning frame with adhesive, in particular with curing adhesive. One insulating layer can also, for example, by insert-molding the plastic forming the positioning frame, be directly connected thereto. The contact plates can be either simply placed onto the associated insulating layers or additionally adhesively bonded thereto. Also by solely placing the layers of the beat generating element, sufficient positioning of the contact plates and the PTC elements relative to the positioning frames can be achieved when applied compression stress is maintained by the connection of the two shielding plates upon the layered structure located within the shielding plates.

For optimum arrangement of the adhesive in a chamber between the face-side rim of the positioning frame and the first and the second shielding plate such that the adhesive bonds at least these three elements and possibly another one or two insulating layers with each other, the outer rim of the positioning frame is preferably specially configured and adapted to the shielding plate or plates, respectively. According to a preferred development, the chamber is at an underside defined substantially only by a rim web formed integrally at the positioning frame. In width direction, the positioning frame is dimensioned such that rim webs being in this width direction oppositely disposed are fitted into the shell element of the lower, i.e. the first shielding plate. The clearance width in the interior of the shielding plate at the level of the rim webs accordingly corresponds substantially to the outer dimension of the rim web. This leaves at most a small gap between the face side of the rim web and the inner surface formed by the longitudinal wall section of the first shielding plate. However, the gap is dimensioned such that this adhesive can not or only to a small extent exit the chamber through the gap during the expected compression of the curing adhesive when the shielding is closed. The rim section is there usually located at the bottom rim of the positioning frame. On the surface of the rim section, commonly the insulating layer associated with the underside also bears on the positioning frame and the rim web. This configuration results in a chamber located within the face side of the rim web and defined by the remaining height of the positioning frame. The rim web can have a height corresponding to one quarter to one sixth of the height of the positioning frame. Above the rim web, the positioning frame may form an inclined surface extending inwardly defining the rim web with an upper end of the positioning frame.

The above description was given in the width direction, i.e. in the perspective of a cross-sectional view through the elongated heat generating element. A corresponding configuration should preferably also be seen in a longitudinal sectional view. Accordingly, the circumferentially encircling rim web of the positioning frame is circumferentially fitted into the pan-shaped first shielding plate in the manner described above, whereby the chamber is above the rim web defined circumferentially towards the bottom.

If the first longitudinal wall section encompasses a second longitudinal wall section of the second shielding plate in the overlapping region on the outside, the second shielding plate defines the chamber on the upper side, possibly an insulating layer bearing thereagainst on the inside, so that curing adhesive located in the chamber there bonds the two shielding plates to each other and seals the second shielding plate encompassed by the first shielding plate. If the shielding plates are each formed as being substantially circumferentially enclosed shells, this results in secure shielding of all electrically conductive and energized elements within the shield.

A method for producing a heat generating element of the aforementioned kind is also proposed with the present invention. A shielding plate is during production first formed having a shell-like configuration. This shielding plate has a circumferentially encircling longitudinal wall. A first lower insulating layer and a lower contact plate commonly in direct contact therewith are first introduced into this shell. Above the contact plate, the PTC element or elements, respectively, comes to bear against the lower contact plate, where a positioning frame surrounds the PTC elements on the outside, where commonly at least one positioning frame forming a holding fixture for at least one PTC element is likewise introduced into the shell. A second contact plate is placed on the opposite side of the PTC element.

The positioning frame is commonly at least together with the contact plates and the PTC element prepared as a preassembled unit, i.e. is introduced as such into the shell-like first shielding plate. The components can there be adhesively bonded to the shielding element and/or the first insulating layer in order to position it. Liquid adhesive is subsequently introduced between a rim of the first shielding plate and the positioning frame. A second shielding plate is in the method according to the invention then, with interposition of a second insulating layer, placed onto the further contact plate in such a manner that the rim of the second shielding plate enters into the liquid adhesive. The latter solidifies, so that the rim of the second contact plate is sealed by the solidified liquid adhesive.

When the rim enters the liquid adhesive, the latter is usually applied pressure and is displaced. Any voids within the bead of adhesive applied are filled in line with this compression. The liquid adhesive is commonly filled in as a circumferential encircling bead of adhesive into the space between the positioning frame and the rim of the first shielding plate. After the liquid adhesive has cured, the region provided within the shielding is hermetically sealed.

The amount of liquid adhesive is preferably adjusted and filled in between the positioning frame and the first shielding plate such that the positioning frame is entirely sealed, without the liquid adhesive contacting any of the contact plates and/or the PTC element. These elements can therefore compensate thermal expansions during heating or cooling, respectively, without directly contacting the shielding or directly contacting parts that are in contact therewith. The adhesive is preferably filled in having a volume which is less than the chamber volume. It is thereby prevented that, when the adhesive is displaced by the rim of the further contact plate, [sic] is displaced to the extent that the adhesive reaches the PTC element and/or the contact plates.

The positioning frame commonly forms connection pieces integrally formed thereon, which extend beyond the shielding on the outside and form channels into which contact pins can be inserted in a sealing manner. It is with this measure possible to contact the heat generating element in the interior while simultaneously maintaining the electrically conductive parts of the heat generating element sealed. Said connecting pieces can at their outer periphery also comprise a seal that allows the heat generating element to be inserted into a corresponding connection housing in a sealed manner, for example, a control housing of an electrical heating device.

Because according to a preferred embodiment of the present invention, the PTC element and/or the contact plates that are in contact therewith are positioned relative to the positioning frames such that at least a respective air gap remains between the exposed surfaces of the contact plates and the PTC element on the one hand, and the positioning frame on the other hand This air gap is interrupted only at certain points at the phase boundary between the PTC element and the positioning frame by support points which are commonly formed by the positioning frame, which basically extend linearly, i.e. at right angles and project beyond the walls of the positioning frame defining the holding fixture and support the at least one PTC element at the outer circumference. The support points act in a punctiform manner against the face side of the PTC element or elements, respectively.

The present invention further proposes a method for producing a heat generating element that is simplified in terms of production engineering. This heat generating element has a PTC element and two contact plates that are in contact therewith on opposite sides. The heat generating element is received in an encasing. This encasing can be the shielding as previously discussed. The encasing, however, need not necessarily be provided electrically insulating against the contact plates and/or have shielding properties. The encasing is in any case sealed by adhesive. This sealing can be done, for example, by connecting shell elements. An area is in the method according to the invention sealed which serves to introduce and/or close a housing of the encasing. The housing can also be a tube in which the PTC element and one of the contact plates are supported. In this case, the other contact plate can be formed by a wall section of the circumferentially closed tube. It is according to the invention proposed to form the adhesive as being thermosetting and to cure it with heat that is generated by energizing the heat generating element. Accordingly, the present method dispenses with passing the mounted heat generating element provided with the adhesive through a heating furnace. It is merely necessary to energize the prepared heat generating element. An operational test can here simultaneously be performed, thereby reducing and simplifying the production steps necessary for producing the heat generating element.

In order to ensure good through heating, the shielding plates have a plate thickness of commonly 0.3 mm and less, thereby improving adhesive curing under heat.

The adhesive is preferably cured by heat prior to the heat generating element being installed in a heating device. The electrical heating device there commonly comprises a frame which usually circumferentially encloses several heat generating elements contained in a layered structure as well as corrugated fin layers bearing thereagainst on both sides and forms through holes for the passage of the medium to be heated. At least the corrugated fin layers are in this through hole usually exposed.

BRIEF DESCRIPTION OF IRE DRAWINGS

Further details and advantages of the present invention shall become apparent from the following description of an embodiment in combination with the drawing. Therein:

FIG. 3 shows a longitudinal sectional view of the heat generating element shown in FIG. 1;

FIG. 4 shows detail IV according to FIG. 3 in an enlarged representation;

FIG. 5 shows detail V according to FIG. 3 in an enlarged representation;

FIG. 6 shows a sectional view taken along line VI-VI according to the representation in FIG. 3; and FIG. 7 shows an enlarged perspective plan view of a face-side end of the heat generating element prior to placing the further shielding plate.

DETAILED DESCRIPTION

Figure 1:
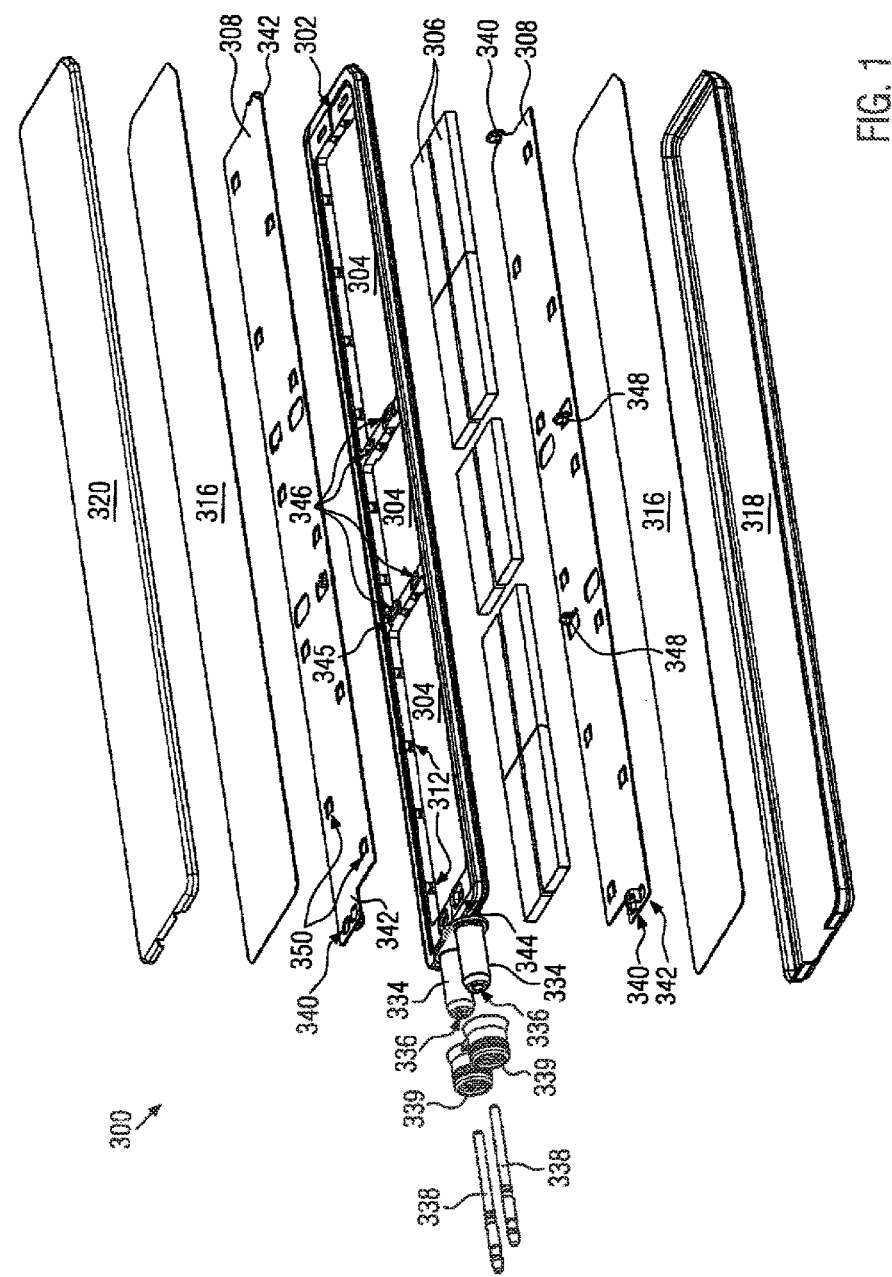
FIG. 1 shows a perspective side view in an exploded representation of a heat generating element.

As illustrated in particular in FIG. 1, an embodiment of a heat generating element 300 shown there is composed of several superimposed layers. The heat generating element 300 is designed substantially symmetrically, where a positioning frame marked with reference numeral 302 is provided at the center and made of electrically insulating material, in particular plastic. The positioning frame 302 forms holding fixtures 304 for PTC elements 306. Two PTC elements 306 are in the width direction received in one holding fixture 304 (cf. FIG. 2). Contact plates 308 bear against opposite sides of the PTC elements 306. These two contact plates 308 are configured identically and formed from punched electrically conductive sheet metal. The contact plates 308 are placed as separate elements onto the PTC elements 306. They can additionally be provided with a vapor-deposited electrode layer as is generally common. The electrode layer, however, is no contact plate 308 within the meaning of the invention.

Figure 2:
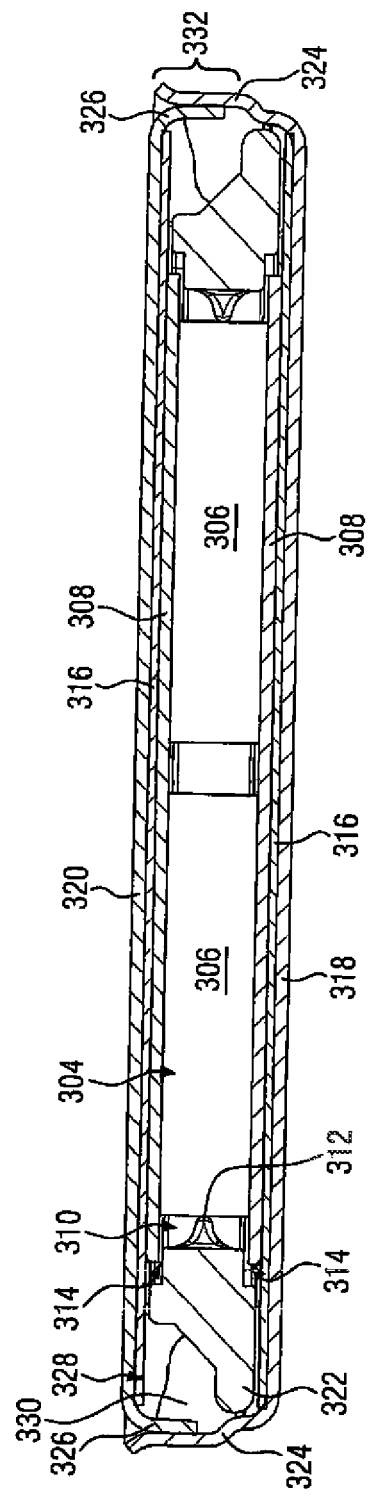
FIG. 2 shows a cross-sectional view of the heat generating element shown in FIG. 1.

The contact plates 308 are sized such that, though being received within the positioning frame 302, they are arranged circumferentially spaced from the positioning frame 302. The circumferential gap thus formed is indicated in FIG. 2 by reference numeral 310. This circumferential gap 310 is formed as an air gap between the inner circumference of the holding fixture 304 and the PTC elements 306 provided therein and is crossed solely by support points 312 tapering in the vertical and width direction and being integrally formed on the positioning frame 302. The support points 312 are substantially pyramid-shaped and respectively spaced from each other distributed on the inner circumference of the holding fixture 304. The surface of the support points 312 is curved—presently concave—for enlarging the creepage distance. As FIG. 2 additionally illustrates, the contact plates 308 are also via an air gap 314 each spaced from the positioning frame 302. The latter has a stepped configuration such that an inner region of the positioning frame 302 defining the holding fixture 304 is notched and inwardly offset. The free rim of the contact plates 308 extending over the PTC elements 306 is located in this notched region. The upper and lower side of the positioning frame, with interpositioning of an insulating layer 316, commonly bear against contact surfaces of a first shielding plate 318 or a second shielding plate 320, respectively. But since care must always be taken that the shielding plates 318, 320 in the vertical direction, with interposition of the insulating layers 316, the contact plates 308, and the PTC elements 306, contact each other directly and with good thermal conductivity, it can be that the positioning frame 302 has a lower height and accordingly is also spaced from one or both insulating layers 316.

The positioning frame 302 at its outer rim forms a circumferential rim web 322 which has a height of about one quarter of the positioning frame 302. At the level of the rim web 322, the shell-like first shielding plate 318 is sized such that the positioning frame 302 with its rim web 322 just fits between oppositely disposed longitudinal wall sections 324 that are presently formed by the first shielding plate 318. The sheet material of the shielding plate 318 is above the rim web 322 slightly bent outwardly, but extends in vertical direction. The free [sic] of the longitudinal wall section 324 is bent outwardly in a funnel-like manner.

The second shielding plate 320 also has oppositely disposed longitudinal wall sections 326 extending in the vertical direction. After joining, they bear against the inner surface of the longitudinal wall sections 324. The free space first formed between the two shielding plates 318, 320 and the positioning frame 302 forms a chamber 328 in which adhesive 330 is received The adhesive 330 is in the circumferential direction formed encircling the positioning frame 302 as bead of adhesive and by solidifying connected, firstly, to the positioning frame 302 and, secondly, to the two shielding plates 318, 320. The same applies to the insulating layer 316, 328 placed onto the second shielding plate 320 and extending outwardly over the chamber. As can be seen from FIG. 2, however, the adhesive 330 is filled in such that it does not reach the interior of the positioning frame 302. As can be seen, the volume of the adhesive 330 is less than the volume of the chamber 328. The adhesive 330 is in the embodiment shown connected only with the positioning frame 302 and the two shielding plates 318, 320. Free surfaces of the contact plates 308 and the PTC elements 306 are therefore free of adhesive 330, so that the adhesive 330 can not contribute to possible creepage paths. The shielding formed by the two shielding plates 318, 320 is sealed by the adhesive 330 in an overlapping region 332 of the two shielding plates 318, 320. Specifically the rim, i.e. in the cross-sectional view according to FIG. 2, the longitudinal wall section 326 of the second shielding plate 320, dips into the bead of adhesive and is therefore after the adhesive is cured sealed in a tight manner in the circumferential direction, so that the inner region of the shielding is sealed by adhesively bonding the two sheet metal shells 318, 320.

Access to the interior of the positioning frame 302 is provided only by connection pieces 334, formed at one face side of the positioning frame 302 and by its material integrally formed thereon, and entirely circumferentially surrounding a channel 336 for receiving the pin-shaped contact elements 338 (cf. FIG. 1). At their free end, the connection pieces 334 support sealing elements formed from thermoplastic elastomer or PTFE with a labyrinthine sealing structure 339, which by insert molding or plugging on can be connected to the associated connection piece 334. On the face side of each positioning frame 302, two connection pieces 334 with an identical configuration and seal are provided for receiving two contact pins 338 for electrically contacting the contact plates 308.

As FIGS. 1 and 4 further illustrate, the contact plates 308 comprise female clip element holding fixtures 340 being produced by punching and bending which are formed on laterally offset protrusions 342 of the contact plate 308, said protrusions 342 terminating within the boundary defined by the adhesive 330 and each covering associated clip openings 344 shaped by the positioning frame 302. The contact pins 338 are exposed in the clip openings 344 and are connected to the female clip element holding fixtures 340 of the contact plates 308. At the connection side of the heat generating element 300 comprising the connection pieces 334, the clip connections described can be realized either by positioning the contact plates 308 in their installed position and subsequently introducing the contact pins 338 through the channels 336 or by locking the female clip element holding fixtures 340 with the contact pins 338 that are already in position 338.

The positioning frame 302 at its face side end and also at cross webs 345, spacing the individual holding fixtures 304 from each other, comprises locking openings 346 with which locking tongues 348 formed on the contact plate 308 by punching and bending engage to connect the contact plate 308 across its entire length to the positioning frame 302 (cf. also FIGS. 5 and 6). Furthermore, multiple flexible tongues 350 are formed on the contact plate 308 by punching and bending and are in preloaded contact with the PTC element 306 for improving contact (cf. FIG. 1).

When producing the embodiment discussed, the positioning frame 302 made of injection molded plastic is first covered on one side with a contact plate 308. The contact plate 308 is by use of the locking tongues 348 clipped to the positioning frame 302. The contact plate 308 on the connection side also locks to the corresponding inner end of the contact pin 338. The PTC elements 306 are no introduced into the holding fixture 304 thus closed at the underside. Thereafter, the other contact plate 308 is in the manner described placed onto the positioning frame 302 and locked thereto.

The heat generating cell of the heat generating element is therewith completed as a preassembled unit. It is now introduced into the first pan-shaped shielding plate 318. Its longitudinal wall section 324 is modified at the connection side such that the contact pins 338 can pass contactlessly through the longitudinal wall section 324.

The adhesive 330 is then filled into the chamber 328 by a circumferentially applied bead of adhesive. The further insulating layer 316 is placed on. Furthermore, the second shielding plate 320 is placed on and with its circumferential longitudinal wall section 326 pressed into the first shell-like shielding plate 318. The adhesive 330 is there slightly displaced and compressed. The adhesive 330 surrounds at least the free end of the second shielding plate 320 and seals this second shielding plate 320. The shielding formed by the shielding plates 318, 320 is thereby hermetically sealed against the atmosphere. Humidity or dirt can not enter the interior of the heat generating element 300.

As FIG. 7 illustrates, the shielding plate 320 as well as the associated positioning frame 302 are provided with mutually associated positioning devices that are in the illustrated embodiment formed by a beveled corner 352 of the first shielding plate 318 and an associated beveled corner 354 of positioning frame 302. Unique positioning of the fitted contact plate 308 in the first shielding plate 318 is determined by these positioning devices. In other words, the positioning frame 302 [can] be mounted in the shell-like first shielding plate 318 only in the direction shown in FIG. 6. It goes without saying that the second shielding plate 320 is formed correspondingly and also engages with the beveled corner 352 of the first shielding plate 318 in the manner previously described and overlaps therewith.

The invention claimed is:

1. A heat generating element for an electrical heating device of a motor vehicle, comprising:
   at least one PTC element and two electrically conductive contact plates which are in contact with opposite sides of said at least one PTC element and which are each provided on an outer side thereof facing away from said at least one PTC element with a respective electrically insulating layer;
   electromagnetic metal shielding being provided and comprising a first shell-like shielding plate and a second shell-like shielding plate which are each provided on the outer side of a respective electrically insulating layer and which are connected thereto in a thermally conductive manner;
   wherein longitudinal wall sections of said second shielding plate extend in a vertical direction toward said first shielding plate and are encircled by longitudinal wall sections of said first shielding plate that extend in a vertical direction toward said second shielding plate to form an overlapping region;
   wherein said first and second shielding plates are sealed by way of an adhesive which is received in said first shielding plate and into which the end of a rim of said longitudinal wall sections of said second shielding plates dips;
   wherein said first and second shielding plates are electrically insulated from the contact plates via the respective insulating layers;
   a positioning frame forms a holding fixture for holding said at least one PTC element; wherein the first shielding plate, the second shielding plate, and the position frame form a chamber; and
   a rim web is formed at the position frame; said rim web disposed in the chamber and oppositely arranged on longitudinal wall sections of said first shielding plate for supporting said at least one PTC element, wherein the adhesive joins the first and second shielding plates and the rim web together in the chamber.

2. The heat generating element according to claim 1, wherein said first and second shielding plates contact each other in said overlapping region.

3. The heat generating element according to claim 1, wherein said heat generating element is, with said electromagnetic shielding, formed as a prefabricated component of a heating device.

4. The heat generating element according to claim 1, wherein a rim side of said insulating layer extends beyond said positioning frame forming a holding fixture for said at least one PTC element and bears on said positioning frame or leaves free only a small gap between itself and said positioning frame to compensate for manufacturing tolerances.

5. A heat generating element according to claim 1, wherein the chamber in which said adhesive is received is formed between a face-side rim of said positioning frame and said first and said second shielding plates.

6. A heat generating element according to claim 5, wherein said chamber is, at an underside thereof, defined by the rim web formed integrally on said positioning frame, and wherein said positioning frame is, at least in a width direction thereof, dimensioned such that rim webs in the width direction are oppositely disposed and are fitted between oppositely disposed longitudinal wall sections of said first shielding plates.

7. A heat generating element according to claim 1, wherein each insulating layer is sandwiched between an associated contact plate and an associated shielding plate.

8. A method for producing a heat generating element, comprising:
   providing electromagnetic shielding, the electromagnetic shielding comprising shell-like first and second shielding plates;
   introducing a first electrically insulating layer and an electrically conductive contact plate into the electromagnetic metal shielding, the contact plate having a PTC element internally in contact therewith;
   placing a further electrically conductive contact plate on the other side onto said PTC element;
   filling a liquid adhesive into said first shielding plate, then placing said second shielding plate onto said further contact plate, with interposition of a second electrically insulating layer, such that longitudinal wall sections of said second shielding plate that extend in a vertical direction toward said first shielding plate are encircled by longitudinal wall sections of said first shielding plate that extend in a vertical direction toward said second shielding plate to form an overlapping region and such that a rim of said second shielding plate enters said liquid adhesive;
   wherein said first and second shielding plates are electrically insulated from the contact plates via the insulating layers; and
   wherein a positioning frame forms a holding fixture for holding said PTC element; wherein the first shielding plate, the second shielding plate, and the position frame form a chamber; and a rim web is formed at the position frame; said rim web disposed in the chamber and oppositely arranged on longitudinal wall sections of said first shielding plate for supporting said PTC element, wherein the adhesive joins the first and second shielding plates and the rim web together in the chamber.

9. A method according to claim 8, further comprising introducing said positioning frame surrounding said PTC element into said shell-like first shielding plate before said further contact plate is placed onto the other side on said PTC element.

10. A method according to claim 9, further comprising introducing said positioning frame, with said PTC element and said contact plates bearing thereagainst on both sides, into said first shielding plate as a preassembled unit.

11. A method according to claim 9, further comprising placing said second shielding plate in contact with said first shielding plate.

12. A method according to claim 8, wherein the filling step comprises introducing an amount of said liquid adhesive in between said positioning frame and said first shielding plate such that said positioning frame is entirely sealed without said liquid adhesive contacting at least one of said contact plates and said PTC element.

13. A method according to claim 8, wherein at least one of said PTC element and said contact plates bearing there against are arranged relative to said positioning frame such that at least a respective air gap remains between exposed surfaces of at least one of said contact plates and said PTC element, on the one hand, and said positioning frame, on the other hand, which air gap is interrupted by support points only at certain points supporting said PTC element at the outer circumference and being formed by said positioning frame.

14. A method according to claim 8, further comprising curing said adhesive with heat by heat generated when energizing said heat generating element.

15. A method according to claim 8, further comprising curing said adhesive prior to installing said heat generating element in a heating device.

16. A heat generating element for an electrical heating device of a motor vehicle, comprising:
   at least one PTC element and two electrically conductive contact plates which are in contact with opposite sides of said at least one PTC element, each of which is provided on an outer side thereof facing away from said at least one PTC element with an electrically insulating layers;
   electromagnetic metal shielding being provided and comprising a first shell-like shielding plate and a second shell-like shielding plate which are each provided on the outer side of a respective one of the insulating layers and which are connected thereto in a thermally conductive manner;
   wherein longitudinal wall sections of said second shielding plate extend in a vertical direction toward said first shielding plate and are encircled by longitudinal wall sections of said first shielding plate that extend in a vertical direction toward said second shielding plate to form an overlapping region;
   wherein said first and second shielding plates are sealed by way of an adhesive which is received in said first shielding plate and into which the end of a rim of said longitudinal wall sections of said second shielding plate dips, wherein said first and second shielding plates are electrically insulated from the contact plates via the insulating layers;
   a positioning frame forms a holding fixture for holding said at least one PTC element; wherein the first shielding plate, the second shielding plate, and the position frame form a chamber;
   a rim web is formed at the position frame; said rim web disposed in the chamber and oppositely arranged on longitudinal wall sections of said first shielding plate for supporting said at least one PTC element, wherein the adhesive joins the first and second shielding plates and the rim web together in the chamber; and
   wherein the first and second shell-like shielding plates have U-shaped cross sections.

* * * * *